United States Patent
Miyamoto et al.

(10) Patent No.: US 11,991,913 B2
(45) Date of Patent: *May 21, 2024

(54) SEMICONDUCTOR DEVICE INCLUDING DETECTION ELECTRODES APPLICABLE FOR A TOUCH SENSOR

(71) Applicant: Japan Display Inc., Tokyo (JP)

(72) Inventors: Mitsuhide Miyamoto, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 15 days.

This patent is subject to a terminal disclaimer.

(21) Appl. No.: 17/862,926

(22) Filed: Jul. 12, 2022

(65) Prior Publication Data

US 2022/0344410 A1 Oct. 27, 2022

Related U.S. Application Data

(63) Continuation of application No. 17/173,610, filed on Feb. 11, 2021, now Pat. No. 11,437,446, which is a (Continued)

(30) Foreign Application Priority Data

Jan. 15, 2016 (JP) .................................. 2016-006329

(51) Int. Cl.
*H10K 59/40* (2023.01)
*G06F 3/041* (2006.01)
(Continued)

(52) U.S. Cl.
CPC .......... *H10K 59/40* (2023.02); *G06F 3/0412* (2013.01); *G06F 3/04164* (2019.05);
(Continued)

(58) Field of Classification Search
CPC ........ H10K 59/40; H10K 50/11; H10K 50/17; H10K 50/171; H10K 50/8426;
(Continued)

(56) References Cited

U.S. PATENT DOCUMENTS 9,385,169 B2 7/2016 Chaji et al.
9,425,434 B2 8/2016 Lee et al.
(Continued)

FOREIGN PATENT DOCUMENTS

JP 2009-116090 A 5/2009
JP 2011-023558 A 2/2011
JP 2014-154450 A 8/2014

*Primary Examiner* — Quoc D Hoang
(74) *Attorney, Agent, or Firm* — Maier & Maier, PLLC

(57) ABSTRACT

A sealing member containing conductive particles and disposed in a seal region is formed between a display panel and a touch panel. A laminated structure formed on the display panel includes a first detection lines. The first detection lines extend from the seal region to a connection region and are connected through the conductive particles to terminals of second detection lines formed on the touch panel. A peripheral edge of the organic barrier is located inward from the conductive particles of the sealing member. The above described structure can facilitate a work for connecting external lines such as FPC to the display panel and the touch panel. Further, the structure can secure stability of electrical connection between the external lines and the touch panel.

17 Claims, 9 Drawing Sheets

Related U.S. Application Data continuation of application No. 16/856,768, filed on Apr. 23, 2020, now Pat. No. 10,957,748, which is a continuation of application No. 16/453,493, filed on Jun. 26, 2019, now Pat. No. 10,672,840, which is a continuation of application No. 16/139,844, filed on Sep. 24, 2018, now Pat. No. 10,381,421, which is a continuation of application No. 15/833,557, filed on Dec. 6, 2017, now Pat. No. 10,109,687, which is a continuation of application No. 15/336,026, filed on Oct. 27, 2016, now Pat. No. 9,871,083.

(51) Int. Cl.
*G06F 3/044* (2006.01)
*H10K 50/11* (2023.01)
*H10K 50/17* (2023.01)
*H10K 50/842* (2023.01)
*H10K 50/844* (2023.01)
*H10K 59/122* (2023.01)
*H10K 59/35* (2023.01)
*H10K 77/10* (2023.01)

(52) U.S. Cl.
CPC ........... *G06F 3/0446* (2019.05); *H10K 50/11* (2023.02); *H10K 50/17* (2023.02); *H10K 50/171* (2023.02); *H10K 50/8426* (2023.02); *H10K 50/844* (2023.02); *H10K 59/122* (2023.02); *H10K 59/35* (2023.02); *H10K 77/111* (2023.02); *G06F 2203/04102* (2013.01); *Y02E 10/549* (2013.01)

(58) Field of Classification Search
CPC .... H10K 50/844; H10K 59/122; H10K 59/35; G06F 3/0412
USPC .......................................................... 257/103
See application file for complete search history.

(56) References Cited

U.S. PATENT DOCUMENTS

| | | |
|---|---|---|
| 9,660,003 B2 | 5/2017 | Sato et al. |
| 9,871,083 B2 | 1/2018 | Miyamoto et al. |
| 10,109,687 B2 | 10/2018 | Miyamoto et al. |
| 10,381,421 B2* | 8/2019 | Miyamoto ............ G06F 3/0412 |
| 10,672,840 B2* | 6/2020 | Miyamoto ............ H10K 50/171 |
| 10,957,748 B2 | 3/2021 | Miyamoto et al. |
| 2009/0115743 A1 | 5/2009 | Oowaki |
| 2014/0225089 A1 | 8/2014 | Kato et al. |
| 2016/0054823 A1 | 2/2016 | Kim |
| 2016/0293685 A1 | 10/2016 | Kato et al. |
| 2016/0293890 A1 | 10/2016 | Kato et al. |

* cited by examiner

SEMICONDUCTOR DEVICE INCLUDING DETECTION ELECTRODES APPLICABLE FOR A TOUCH SENSOR

CROSS-REFERENCE TO RELATED APPLICATION

This application is a continuation of U.S. application Ser. No. 17/173,610, filed Feb. 11, 2021, which is a continuation application of U.S. application Ser. No. 16/856,768, filed Apr. 23, 2020 (now U.S. Pat. No. 10,957,748), which is a continuation of U.S. application Ser. No. 16/453,493, filed Jun. 26, 2019 (now U.S. Pat. No. 10,672,840), which is a continuation of U.S. Application Ser. No. 16/139,844, filed Sep. 24, 2018 (now U.S. Pat. No. 10,381,421), which is a continuation of U.S. application Ser. No. 15/833,557, filed Dec. 6, 2017 (now U.S. Pat. No. 10,109,687), which is a continuation of U.S. application Ser. No. 15/336,026, filed Oct. 27, 2016 (now U.S. Pat. No. 9,871,083) and claims priority of Japanese Application No. 2016-006329, filed on Jan. 15, 2016. The content of each of the above-identified applications is hereby incorporated by reference.

BACKGROUND OF THE INVENTION

1. Field of the Invention

The present invention relates to a display device.

2. Description of the Related Art

Some liquid crystal display devices and some organic EL display devices include a touch panel to detect positions of user's fingers on the panel. A touch panel described in JP2009-116090A (hereinafter referred to as "Patent document 1") has a plurality of first detection electrodes and a plurality of second detection electrodes formed on one surface of the touch panel. The first detection electrodes are aligned in a longitudinal direction, and the second detection electrodes are aligned in a lateral direction. An edge of the touch panel (referred to as "front pad portion" in Patent Document 1) has terminals formed thereon that are respectively provided in detection lines extending from detection electrodes. An external flexible printed circuit (FPC) is attached to the terminals.

Display panels of organic EL display devices include an organic layer including a light emitting layer made of organic materials. The organic layer tends to be deteriorated under the influence of moisture. In order to prevent moisture from penetrating the organic layer, some organic EL display devices include a barrier layer covering the organic layer. JP2014-154450A discloses a barrier layer including two inorganic barrier layers between which an organic barrier is disposed.

SUMMARY OF THE INVENTION

Similarly to in the organic EL display device disclosed in patent document 1, in organic EL display device including a touch panel, external electric lines such as FPCs are connected to the display panel and the touch panel of the display device. However, the conventional structure has a problem that laborious works are necessary for connecting the external electric lines to the display panel and the touch panel, respectively.

The present invention is to provide a technology that facilitates works for connecting external electric lines such as FPCs to the display panel and the touch panel and that secures stability of electrical connection between the external electric line and the touch panel provided in a display device including a multilayer barrier covering the organic layer.

A display device comprising: a display panel including a display region; a touch panel facing the display panel; a seal region located outside the display region and surrounding the display region; and a connection region located outside a portion of a peripheral edge of the seal region. The display panel includes a first substrate and a first laminated structure formed on a surface of the first substrate facing the touch panel. The touch panel includes a second substrate and a second laminated structure formed on a surface of the second substrate facing the display panel. The first laminated structure includes: an organic layer including a light emitting layer and formed on the display region; a multilayer barrier covering the whole of the organic layer and including a first inorganic barrier layer that includes an inorganic material, an organic barrier layer that includes an organic material and is formed on the first inorganic barrier layer, and a second inorganic barrier layer that includes an inorganic material and covers the whole of the organic barrier layer. The second laminated structure includes a circuit layer including a detection electrode and a second detection line that extends from the detection electrode and includes a terminal in the seal region. A sealing member is located in the seal region and disposed between the display panel and the touch panel, the sealing member containing a conductive particle. The first laminated structure includes a first detection line extending from the seal region to the connection region and electrically connected to the terminal of the second detection line through the conductive particle. The organic barrier layer includes a peripheral edge located inward from the conductive particle.

In the display device described above, the first detection line is formed on the display panel and thus the works for connecting external lines such as FPC to the display panel and the touch panel can be facilitated. Further, because the peripheral edge of the organic barrier layer is located inward from the conductive particle, stability of electrical connection between the external electric line and the touch panel can be secured.

DETAILED DESCRIPTION OF THE INVENTION

Figure 1:
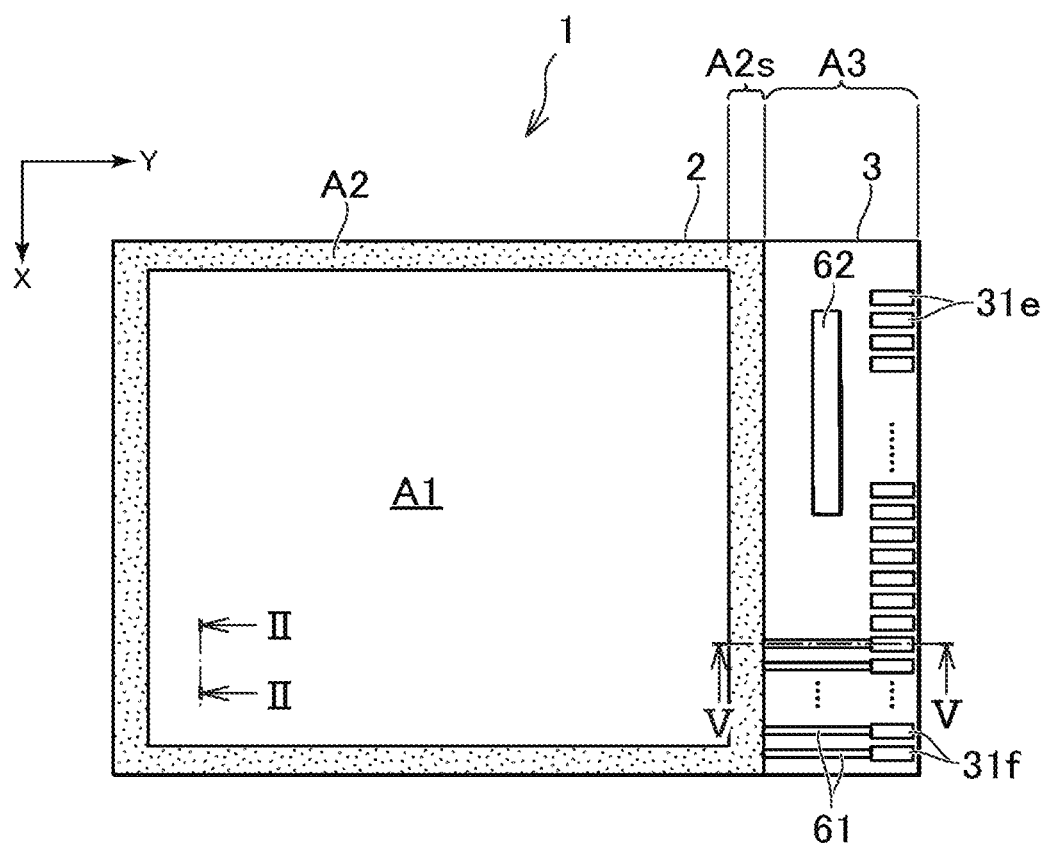
FIG. 1 illustrates an exemplary display device of embodiments according to the present invention.
Figure 2:
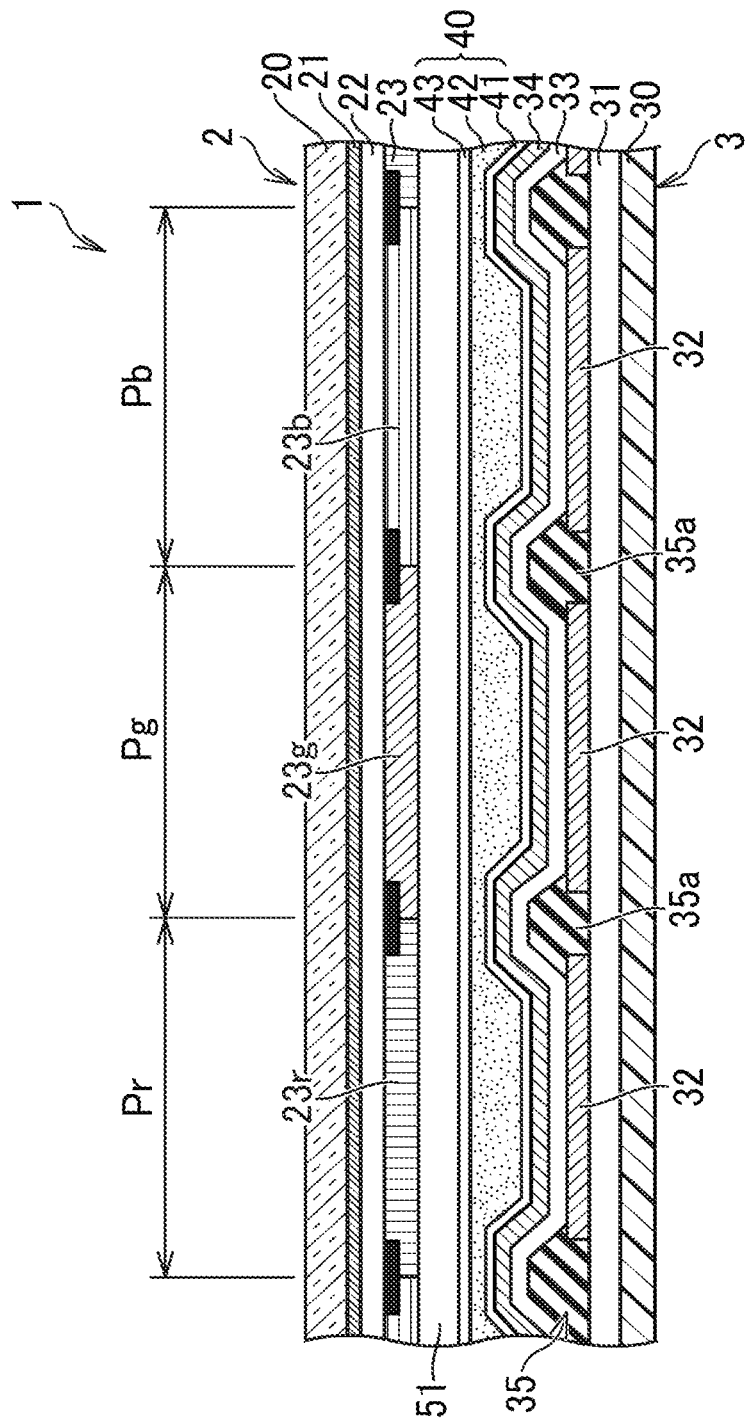
FIG. 2 is a cross section taken along line II-II in FIG. 1.
Figure 3:
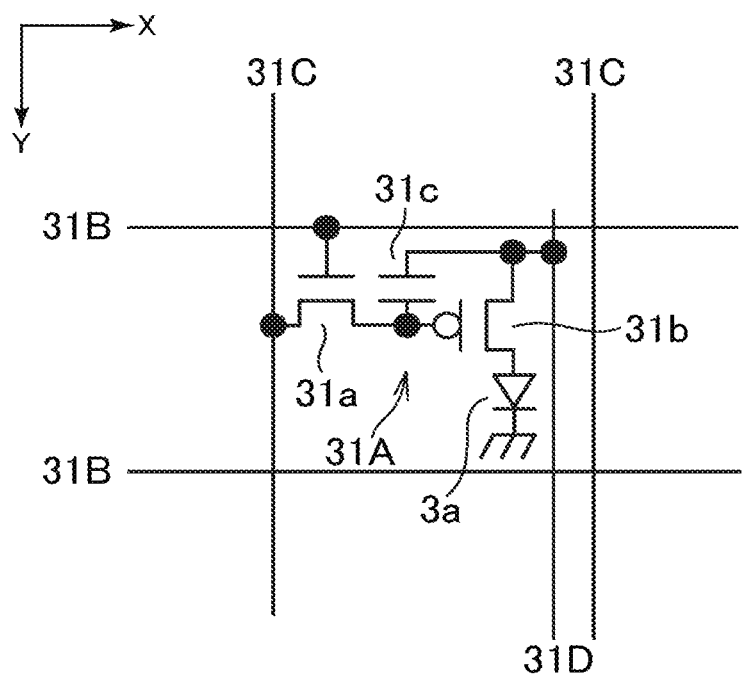
FIG. 3 illustrates an exemplary circuit formed in a circuit layer of the display device.
Figure 4:
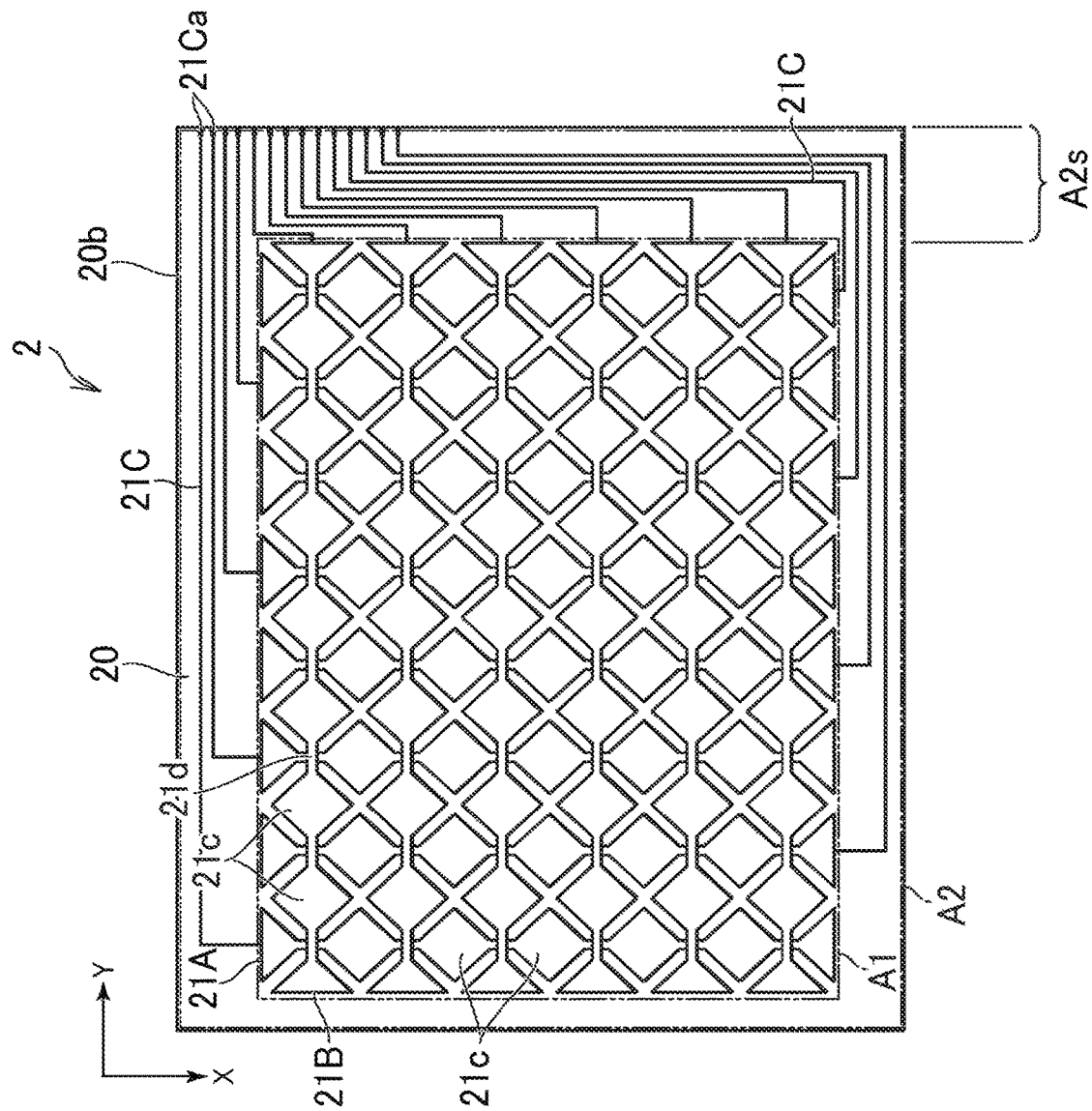
FIG. 4 illustrates an exemplary conductor pattern formed in a circuit layer of a touch panel.
Figure 5:
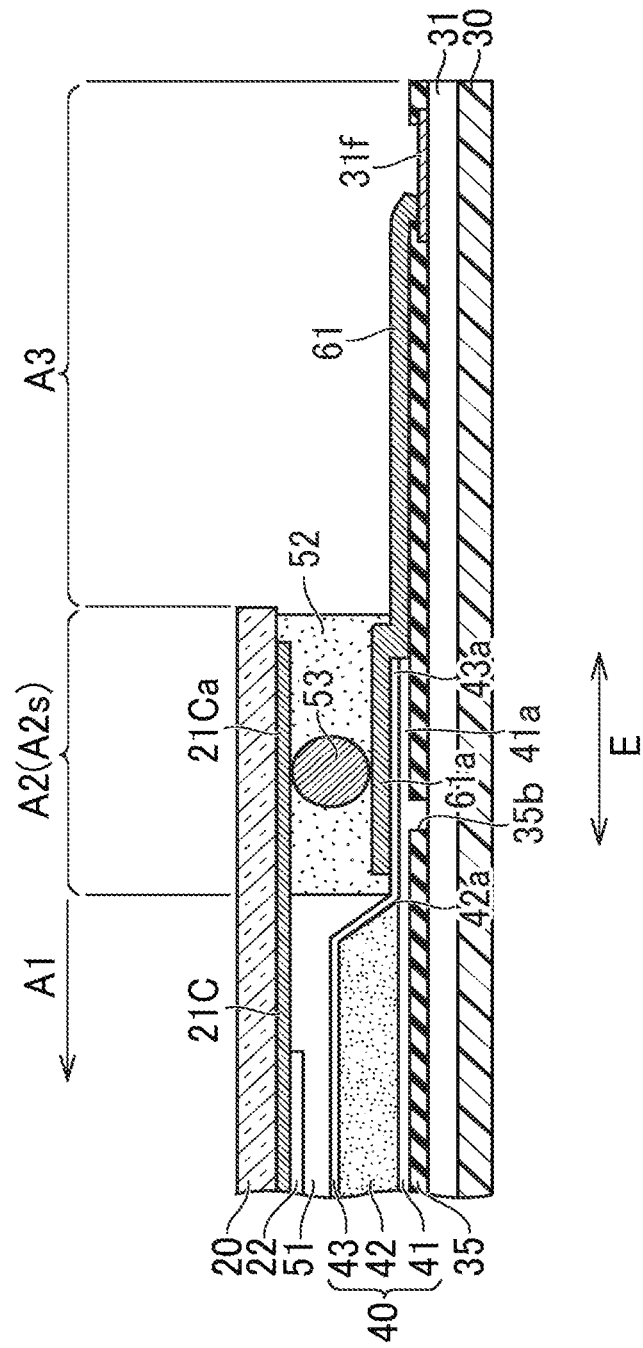
FIG. 5 is a cross section taken along line V-V indicated in FIG. 1.
Figure 6:
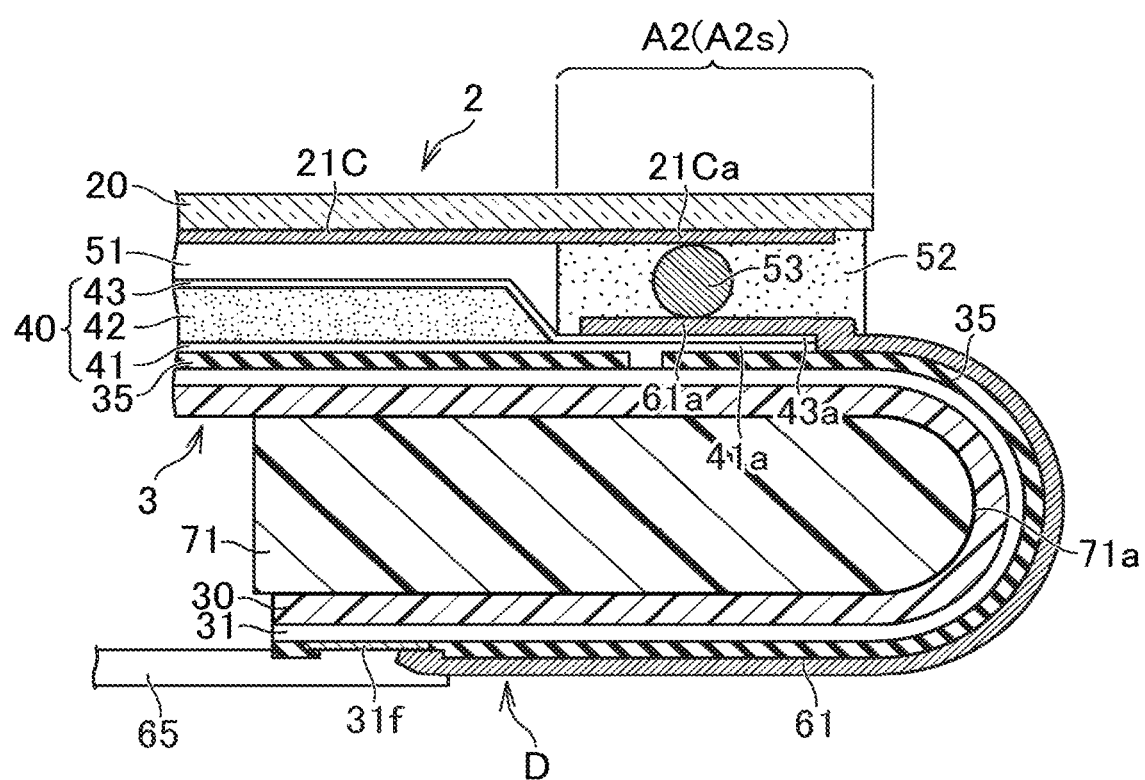
FIG. 6 is a cross section illustrating a state where a connection region in the display panel is folded. The cross section plane of the FIG. 6 is the same as that of FIG. 5.

Hereinafter, embodiments according to the present invention will be described. FIG. 1 illustrates a display device 1 that is an example of the embodiments according to the present invention. FIG. 2 is a cross section taken along line II-II in FIG. 1. FIG. 3 illustrates an exemplary circuit formed in a circuit layer 31 of the display panel 3. FIG. 4 illustrates an exemplary conductor pattern formed in a circuit layer 21 of a touch panel 2. FIG. 5 is a cross section taken along line V-V indicated in FIG. 1. FIG. 6 is a cross section illustrating a state where a connection region A3 in the display panel 3 is folded. The following explanation refers to a direction toward the touch panel 2 from the display panel 3 as "upward direction", and refers to a direction toward the display panel 3 from the touch panel 2 as "downward direction". Further, the following explanation refers to a direction toward the center of a display region described later as "inward direction".

The present specification merely discloses an example. Thus, embodiments which maintain the spirit of the present invention and are easily modified by those skilled in the art are surely contained in the scope of the invention. In addition, a width, a thickness, and a shape of each portion shown in the drawings are merely an example. The width, the thickness, and the shape shown in the drawings do not limit the interpretation of the invention.

The organic electroluminescent (EL) display device 1 includes a display panel 3 and a touch panel 2 facing the display panel 3. As shown in FIG. 1, the display panel 3 and the touch panel 2 include a display region A1 constituted by a plurality of pixels, and include a seal region A2 located outside display region A1. The seal region A2 has a sealing member 52 (see FIG. 5) disposed therein. The sealing member 52 is formed between the display panel 3 and the touch panel 2 to adhere those panels to each other. The display panel 3 includes a connection region 3 located outside a portion of a peripheral edge (e.g., one side of the rectangularly shaped seal region A2) of the seal region A2. The touch panel 2 has a size correspond to the display region A1 and the seal region A2 each formed on the display panel 3. Accordingly, the touch panel 2 does not cover the connection region 3. The display panel 3 is rectangular, and the connection region A3 is located along one of the four sides of the rectangular display panel 3. The connection region 3 has an external electric line attached thereon. In the example described in the present specification, a flexible printed circuit (FPC) 65 is employed as the external electric line and attached on the connection region 3 (see FIG. 6). In this regard, a non-light emitting region in which pixels are not formed and the sealing member 52 is not provided may be secured between the display region A1 and the seal region A2 shown in FIG. 1. The non-light emitting region has, for example, a driver circuit formed thereon.

As shown in FIG. 2, the display panel 3 includes a first substrate 30. The first substrate 30 is made of resin, such as polyimide resin, and has flexibility. As described later, the flexibility allows the connection region A3 of the display panel 3 to be folded opposite the touch panel 2 (see FIG. 6).

The first substrate 30 includes a surface facing the touch panel 2. The display panel 3 includes a laminated structure on the surface of the first substrate 30. The laminated structure of the display pane 13 is formed between the first substrate 30 and a filler 51 shown in FIG. 2. The following explanation refers to the laminated structure as "first laminated structure".

As shown in FIG. 2, the first laminated structure includes an organic layer 33 including a light emitting layer. The organic layer 33 may further include a hole injection layer, a hole transmission layer, an electron injection layer, and an electron transmission layer. In the example of organic EL display device 1, the organic layer 33 has a common laminated structure throughout the region of pixels so that the entire organic layer 33 emits light of the same color (e.g., white light). In another example, the organic layer 33 may have a laminated structure of the pixels that correspond to the respective colors so as to emit light of colors of the respective pixels. For example, the organic layer 33 in the red pixel Pr may be formed so as to emit red light, the organic layer 33 in the green pixel Pg may be formed so as to emit green light, and the organic layer 33 in the blue pixel Pb may be formed so as to emit blue light.

As shown in FIG. 2, the first laminated structure includes a plurality of lower electrodes 32 respectively formed on the plurality of pixels. Further, the first laminated structure includes a bank layer 35. The bank layer 35 has banks 35a formed therein. Each bank 35 is located between two adjacent pixels and disposed on the peripheral portion of the lower electrode 32. The organic layer 33 is formed on the lower electrodes 32 and the bank layer 35. The organic layer 33 has a portion that is located inside the banks 35 and is in contact with the lower electrode 32. An upper electrode 34 is formed on the organic layer 33. In an example, the upper electrode 34 is continuously formed throughout the display region A1. The lower electrode 32 and the upper electrode 34 supply electric charges (that is, electric current) to the organic layer 33. For example, the lower electrode 32 is an anode to supply holes to the organic layer 33. The upper electrode 34 is a cathode to supply electrons to the organic layer 33.

As shown in FIG. 2, the first laminated structure includes a circuit layer 31 formed on the first substrate 30. The lower electrodes 32 are formed above the circuit layer 31. The circuit layer 31 has circuits formed therein that control electric current to be supplied to the lower electrodes 32. As shown in FIG. 3, the circuit layer 31 includes a pixel circuit 31A formed in each pixel. The pixel circuit 31A includes a plurality of TFTs (Thin Film Transistor) 31a, 31b, capacitor 31c, and the like. Further, the circuit layer 31 has scan signal lines 31B extending in an X direction, image data signal lines 31C extending in a Y direction, and drive power source lines 31D extending in the Y direction. The scan signal lines 31B are respectively formed for pixel rows that are arranged in the Y direction. The image data signal lines 31C are respectively formed for pixel lines that are arranged in the X direction. The scan signal lines 31B are selected in order by a scan signal line drive circuit (not shown). The selected scan signal line 31B receives a voltage for turning on a switching TFT 31a formed in each pixel. The image data signal line 31c receives a voltage corresponding to a data signal for a pixel that is connected to the selected scan signal line 31B. The voltage is applied to the capacitor 31c through the switching TFT 31a. A drive TFT 31b supplies OLED 3a with an electric current corresponding to the voltage applied to the capacitor 31c. As a result, the OLED 3a in the pixel connected to the selected scan signal line 31B emits a light. The lower electrodes 32, the organic layer 33, and the upper electrode 34 constitute the OLEDs 3a. The electric current is supplied to the OLED 3a through the drive power source line 31D and the drive TFT 31b. The anode of the OLED 3a (lower electrode 32) is connected to the drive TFT 31b. The cathode of the OLED 3a is connected to the ground potential. The cathodes of all OLEDs 3a employ a common electrode (that is, the upper electrode 34). In this regard, the pixel circuit 31A is not limited to the example shown in FIG. 3 and may be changed in various ways.

As shown in FIG. 1, the connection region A3 of the display panel 3 has a plurality of first terminals 31e formed thereon and a plurality of second terminals 31f formed thereon. The first terminals 31e are provided for the circuits formed in the circuit layer 31. In an example, a driver IC 62 is mounted on the connection region A3. The circuit layer 31 has a plurality of lines (not shown) formed therein that connect the driver IC 62 to the first terminals 31e. Further, the circuit layer 31 has a plurality of lines (not shown) formed therein that connect the driver IC 62 to the scan signal lines 31B, the image data signal lines 31C, and the drive power resource lines 31D. On the other hand, the second terminals 31f are provided at the ends of the detection lines 61 electrically connected to the touch panel 2 (hereinafter, the detection line 61 is referred to as "first detection line"). As shown in FIG. 5, the peripheral edges of the terminals 31e and 31f may be covered with the bank layer 35, which prevents the terminals 31e and 31f from being peeling off. Alternatively, the peripheral edges of the terminals 31e and 31f are covered with inorganic barrier layers 41 and 43 described later.

The first terminals 31e are connected with external lines that supply the display panel 3 with signals to drive the display panel 3. The second terminals 31f are connected with external lines that transmit signals from the touch panel 2 to an external controller. In the example of organic EL display device 1, FPC 65 (shown in FIG. 6) is employed as both of the external lines connected to the first terminals 31e and the external lines connected to the second terminals 31f.

For example, as shown in FIG. 1, all of the second terminals 31f are arranged on one side of the plurality of first terminals 31e. The arrangement of the second terminals 31f is not limited to the example shown in FIG. 1. In another example, the second terminals 31f may be distributed on two sides of the plurality of first terminals 31e.

As shown in FIG. 2, the first laminated structure includes a multilayer barrier 40 that prevents moisture from penetrating and spreading in the organic layer 33. The multilayer barrier is formed on the upper electrode 34 to cover the entire organic layer 33. In other words, the multilayer barrier 40 includes a peripheral edge located outside the peripheral edge of the organic layer 33. The multilayer barrier 40 includes a first inorganic barrier layer 41, an organic barrier 42 formed on the first inorganic barrier layer 41, and a second inorganic barrier layer 43 formed on the organic barrier 42. That is, the organic barrier 42 is sandwiched between the first inorganic barrier layer 41 and the second inorganic barrier layer 43. The first inorganic barrier layer 41 and the second inorganic barrier layer 43 are made of an inorganic material. Examples of the inorganic material are silicone nitride (Sin), silicone oxide (Sio), and the like. The first inorganic barrier layer 41 and the second inorganic barrier layer 43 may be made of the same material, or may be made of different materials from one another. Each of the first inorganic barrier layer 41 and the second inorganic barrier layer 43 may include a plurality of layers. The organic barrier 42 is made of an organic material. The material of the organic barrier 42 is, for example, an acrylic resin, a polyimide resin, an epoxy resin. When a foreign particle invades the upper electrode 34 or the first inorganic barrier layer 41, for example, the organic barrier 42 covers and encloses the foreign particle so that the barrier efficiency can be prevented from being deteriorated due to the foreign particle. The second inorganic barrier layer 43 covers the entire organic barrier 42. In a plan view of the display panel 3 (see FIG. 5), the peripheral portion 41a of the first inorganic barrier layer 41 and the peripheral portion 43a of the second inorganic barrier layer 43 are located outside the peripheral edge 42a of the organic barrier 42. The peripheral portion 41a of the first inorganic barrier layer 41 and the peripheral portion 43a of the second inorganic barrier layer 43 are in contact with each other and have the organic barrier 42 formed inside the peripheral portions 41a and 43a. The structure described here can prevent moisture from penetrating and spreading in the organic barrier 42. The organic barrier 42 in an example has thickness larger than that of the inorganic barrier layers 41 and 43.

As shown in FIG. 2, the touch panel 2 includes a second substrate 20. The second substrate 20 may employ a glass substrate or a resin substrate, such as an acrylic substrate. The second substrate 20 includes a surface facing the display panel 3. The touch panel 2 includes a laminated structure formed on the surface of the second substrate 20. The laminated structure of the touch panel 2 is layers formed between the second substrate 20 and the filler 51 shown in FIG. 2. Hereinafter, the laminated structure is referred to as "second laminated structure". The second laminated structure includes a circuit layer 21.

As shown in FIG. 4, the circuit layer 21 includes a conductor pattern that includes a plurality of first detection electrodes 21A each extending in the X direction and a plurality of second detection electrodes 21B each extending in the Y direction. The first detection electrodes 21A are arranged in the Y direction. The second detection electrodes 21B are arranged in the X direction. In an example of the circuit layer 21, each of the first detection electrodes 21A includes a plurality of square portions 21c arranged in the X direction and connecting portions 21d each coupling two adjacent square portions 21c together. Similarly to the first detection electrodes 21A, each of the second detection electrodes 21B includes a plurality of square portions 21c arranged in the Y direction and connecting portions 21d each coupling two adjacent square portions 21c together. The connecting portion 21d of the first detection electrode 21A and the connecting portion 21d of the second detection electrode 21B cross and have an insulating layer formed therebetween. The touch panel 2 works as a capacitive touch sensor by using the detection electrodes 21A and 21B described above.

The conductor pattern of the circuit layer 21 includes a plurality of detection lines 21C respectively extending from ends of detection electrodes 21A and 21B (hereinafter, the detection line 21C is referred to as "second detection line"). The second detection lines 21C are formed along edges of the touch panel 2. Each of the sensor detection lines 21C includes terminal 21Ca at the end thereof. The detection electrodes 21A and 21B of the circuit layer 21 are made of a transparent conductive material such as Indium Tin Oxide (ITO), Indium Zinc Oxide (IZO), and the like. The second detection lines 21C may be made of a transparent conductive material or a metal.

As shown in FIG. 2, the second laminated structure may include a protection insulating layer 22 covering the circuit layer 21. Further, the second laminated structure may include a color filter layer 23 formed on the lower side of the protection insulating layer 22. The color filter layer 23 has color filters 23r, 23g, and 23b formed therein that each have the color of the pixel.

As described above, the second detection lines 21C are formed along the edges of the touch panel 2. As shown in FIGS. 4 and 5, each second detection line 21C includes a terminal 21Ca in the end thereof. The terminal 21Ca is located in the seal region A2. The seal region A2 in a plan view is shaped in a frame surrounding the display region A1. The seal region A2 includes a portion A2s (see FIG. 4) located close to the connection region A3 of the display panel 3 (hereinafter, the portion A2s is referred to as "connection side seal region"). The terminals 21Ca of the plurality of second detection lines 21C are formed in the connection side seal region A2s. In an example of organic EL display device 1, all terminals 21Ca are located in one side of the connection side seal region A2s (in FIG. 4, all terminals 21Ca are arranged close to an edge 20b of the second substrate 20). The positions of the terminals 21Ca are not limited to those described here. For example, the plurality of terminals 21Ca may be located on both sides of the connection side seal region A2s.

As shown in FIG. 5, the seal region A2 has a sealing member 52 disposed therein. The sealing member 52 is disposed between the display panel 3 and the touch panel 2 to bond the display panel 3 and the touch panel 2 together. The display panel 3 and the touch panel 2 have a filler 51 disposed therein. The filler 51 is located inside the seal region A2 and the sealing member 52 seals a space filled with the filler 51.

As shown in FIG. 5, the first laminated structure of the display panel 3 includes a plurality of first detection lines 61. The first detection lines 61 extend to the connection region A3 from the connection side seal region A2s. Each first detection line 61 includes a portion 61a formed in the connection side seal region A2s (hereinafter, the portion 61a is referred to as "contact portion"). The first detection line 61 extends to the second terminal 31f in the connection region A3 from the contact portion 61a. In the example in FIG. 1, each first detection line 61 extends straight in the y direction. The first detection lines 61 are made of a metal that includes, for example, Al, Ag, and the like. The arrangement and the material of the first detection line 61 are not limited to the example described here and may be changed in various ways.

As shown in FIG. 5, the contact portions 61a of the first detection lines 61 respectively face the terminals 21Ca of the second detection lines 21C formed in the touch panel 2 in a thickness direction of the panels 2 and 3 across the sealing member 52. The contact portions 61a of the first detection lines 61 are formed in the first laminated structure and exposed toward the sealing member 52. The terminals 21Ca of the second detection lines 21C are formed in the second laminated structure and exposed toward the sealing member 52. The sealing member 52 includes conductive particles 53 made of conductive material. The contact portions 61a of the first detection lines 61 are electrically connected with the terminals 21Ca of the second detection lines 21C, respectively, through the conductive particles 53. In other words, each contact portion 61a of the first detection line 61 is in contact with the conductive particle 53, and each terminal 21Ca of the second detection line 21C is in contact with the conductive particle 53. The first detection lines 61 enable a FPC for the touch panel 2 to be attached on the connection region A3 of the display panel 3, not on the touch panel 2. Accordingly, workability for attaching the FPC to the display device 1 can be facilitated.

The conductive particle 53 has a diameter that corresponds to the distance between the touch panel 2 and the display panel 3, for example. In more detail, the conductive particle 53 has a diameter that corresponds to the distance between the contact portion 61a of the first detection line 61 and the terminal 21Ca of the second detection line 21C. The diameter enables the contact portion 61a of the first detection line 61 and the terminal 21Ca of the second detection line 21C to be in contact with a common conductive particle 53. Further, the conductive particle 53 can function as a spacer. The diameter of the conductive particle 53 is preferably larger than the thickness of the multilayer barrier 40. Such a larger diameter enables the contact pressure between the conductive particle 53 and the second detection line 21C and the contact pressure between the conductive particle 53 and the first detection line 61 to be adequately secured. The diameter of the conductive particle 53 is not limited to the example described here. For example, the diameter of the conductive particle 53 may be smaller than the distance between the contact portion 61a of the first detection line 61 and the terminal 21Ca of the second detection line 21C. In that case, the contact portion 61a and the terminal 21Ca may be connected with each other through a plurality of conductive particles 53.

As shown in FIG. 5, the peripheral edge 42a of the organic barrier 42 is located inward from the conductive particles 53 contained in the sealing member 52. In other words, the peripheral edge 42a of the organic barrier 42 is located closer to the display region A1 than the conductive particles 53. In an example where a non-light emitting region is formed between the display region A1 and the seal region A2, the peripheral edge 42a of the organic barrier 42 may be located in the non-light emitting region. The organic barrier 42 is relatively soft, because it is made of an organic material. Accordingly, in comparison with a structure where the conductive particles are located above the organic barrier 42, the structure shown in FIG. 5 where the peripheral edge 42a of the organic barrier 42 is located inward from the conductive particles 53 easily secures adequate contact pressures between the conductive particle 53 and the contact portion 61a of the first detection line 61 and between the conductive particle 53 and the terminal 21Ca of the second detection line 21C. As a result, the electrical connection between them can be improved in the stability. In an example, a plurality of conductive particles 53 may be arranged in the width direction (E direction shown in FIG. 5) of the connection side seal region A2s. In this example, the plurality of conductive particles 53 make an electrical connection between the contact portion 61a of the first detection line 61 and the terminal 21Ca of the second detection line 21C. In this example, the peripheral edge 42a of the organic barrier 42 is preferably located inward from the conductive particle 53 disposed innermost among the plurality of conductive particles 53 (that is, the peripheral edge 42a is preferably located inward from the conductive particle 53 disposed closest to the display region A1 among the plurality of conductive particles 53).

In the example of organic EL display device 1, the peripheral edge 42a of the organic barrier 42 is located inward from a portion of the seal region A2 in which the conductive particle 53 is disposed. That is, the peripheral edge 42a of the organic barrier 42 is located inward from the inner edge of the connection side seal region A2s. That is, the peripheral edge 42a of the organic barrier 42 is located closer to the display region A1 than the inner edge of the connection side seal region A2s. The arrangement of the organic barrier 42 described here can secure a further adequate contact pressure between the conductive particle 53 and the contact portion 61a of the first detection line 61 and a further adequate contact pressure between the conductive particle 53 and the terminal 21Ca of the second detection line 21C. The entire peripheral edge 42a of the organic barrier 42 may be located inward from the seal region A2. That is, the peripheral edge 42a of the organic barrier 42 may be located inward from, not only the inner edge of the connection side seal region A2s, but also inner edges of other portions of the seal region A2.

As shown in FIG. 5, each of the first inorganic barrier layer 41 and the second inorganic barrier layer 43 includes a portion located in the seal region A2. The portions of the first inorganic barrier layer 41 and of the second inorganic barrier layer 43 are in contact with each other. The portions described here enable the organic barrier 42 to be surely enclosed by the first inorganic barrier layer 41 and the second inorganic barrier layer 43, even when the peripheral edge 42a is positioned closer to the seal region A2. Accordingly, moisture is surely prevented from penetrating into the organic barrier 42. In the example of organic EL display device 1, the peripheral portion 41a of the first inorganic barrier layer 41 and the peripheral portion 43a of the second inorganic barrier layer 43 are located in the seal region A2 and in contact with each other. Alternatively, only one of the peripheral portion 41a of the first inorganic barrier layer 41 and the peripheral portion 43a of the second inorganic barrier layer 43 may be located in the seal region A2. For example, only the peripheral portion 43a of the second inorganic barrier layer 43 may be located on the seal region A2.

As shown in FIG. 5, in the example of organic EL display device 1, the inorganic barrier layers 41 and 43 are formed in the display region A1 and the seal region A2, while not formed in the connection region A3. The peripheral edges of the inorganic barrier layers 41 and 43 are located inward from the peripheral edge of the seal region A2. As described later, the connection region A3 of the display panel 3 is folded back (see FIG. 6). In comparison with a structure where the inorganic barrier layers 41 and 43 are formed in the connection region A3, the structure shown in FIG. 5 where the inorganic barrier layers 41 and 43 are not formed in the connection region A3 reduces the rigidity of the connection region A3 of the display panel 3 to facilitate folding the connection region A3. The inorganic barrier layers 41 and 43 can be formed by, for example, using a mask. For example, the inorganic barrier layers 41 and 43 can be formed by a mask to block a material of the inorganic barrier layers 41 and 43 from being put on the connection region A3. The inorganic barrier layers 41 and 43 can be formed, for example, by Chemical Vapor Deposition (CVD). Alternatively, the inorganic barrier layers 41 and 43 may be formed on the connection region A3, while not covering the second terminals 31f. In that case, the inorganic barrier layers 41 and 43 can be formed by using a mask to block the material of the inorganic barrier layers 41 and 43 from being put on the second terminal 31f.

As shown in FIG. 5, the circuit layer 31 includes a portion located in the connection region A3. The portion of the circuit layer 31 has a plurality of lines (not shown) formed therein that connects the driver IC 62 to the plurality of first terminals 31e (see FIG. 1). Further, the portion of the circuit layer 31 has a plurality of lines (not shown) formed therein that connects the driver IC 62 to the scan signal lines 31B, the image data signal lines 31C, the driver circuit, and the drive power resource lines 31D. The first laminated structure of the display panel 3 includes an insulating layer formed in the connection region A3 and covering the circuit layer 31. The first detection lines 61 are formed above the insulating layer. The structure described here enables the plurality of lines in the circuit layer 31 to be formed under the first detection lines 61. Accordingly, the structure described here increases the flexibility in the layout of the plurality of lines.

In the example of organic EL display device 1, the bank layer 35 is formed as the above described insulating layer between the first detection line 61 and the circuit layer 31. In comparison with a structure where a dedicated insulating layer insulates the detection lines 61 from the circuit layer 31, the structure described above can reduce the number of manufacturing processes.

As shown in FIG. 5, the peripheral portions 41a and 43a of the inorganic barrier layers 41 and 43 are formed on the bank layer 35. The contact portions 61a of the first detection line 61 are formed on the peripheral portions 41a and 43a of the inorganic barrier layers 41 and 43. Alternatively, only one of the peripheral portions 41a and 43a of the inorganic barrier layers 41 and 43 may be formed on the bank layer 35. The bank layer 35 includes a split portion (a groove portion) 35b in the seal region A2. The slit portion 35b is formed along the entire periphery of the seal region A2. The split portion 35b can prevent moisture from spreading in the bank layer 35. The contact portions 61a of the first detection lines 61 are located above the slit portion 35b.

As described above, the plurality of second terminals 31f are formed in the connection region A3. The plurality of second terminals 31f are connected with the ends of the plurality of first detection lines 61, respectively. The second terminals 31f are formed in the same layer as the first terminals 31e. For example, both of the first terminals 31e and the second terminals 31f are formed in the conducive layer in which the circuits in circuit layer 31 are formed. The structure described here evens the height of the second terminals 31f and the height of the first terminals 31e, and thus enables the common FPC 65 to be stably attached on the first terminals 31e and the second terminals 31f. Specifically, a pressure applied on the second terminals 31f from the FPC 65 and a pressure applied on the first terminals 31e from the FPC 65 can be equalized in a manufacturing process where the FPC 65 is pressed on the connection region A3 of the display panel 3. The FPC 65 is bonded to the display panel 3 by, for example, aerotropic conductive adhesive. The ends of the second terminals 31f toward the seal region A2 are in contact with the ends of the first detection lines 61.

As shown in FIG. 1, in the example of organic EL display device 1, the plurality of first terminals 31e and the plurality of second terminals 31f on the ends of the first detection lines 61 are arrayed in one direction. The arrangement of the terminals 31f and 31e described here can facilitate work for pressing the FPC 65 to the first terminals 31e and the second terminals 31f.

The organic EL display device 1 can be manufactured by the processes exampled as follows. The circuit layer 31 and the lower electrodes 32 are formed on the first substrate 30. Then, the bank layer 35 is formed so as to cover the peripheral portions of the lower electrodes 32. In the process, the bank layer 35 is formed not to cover the first terminals 31e and the second terminals 31f. After that, the organic layer 33 and the upper electrode 34 are formed. Then, the inorganic barrier layer 41, the organic barrier 42, and the second inorganic barrier layer 43 are formed on the upper electrode 34 in the order of the layer 41, the barrier 42, and the layer 43. As described above, the inorganic barrier layers 41 and 43 are formed by using a mask so that the material thereof does not cover the connection region A3 (or terminals 31e,31f). As described above, the peripheral edge 42a of the organic barrier 42 is located inward from the seal region A2. Such an organic barrier 42 can be made by using a mask having an opening inside the seal region A2. For example, the organic barrier 42 can be formed by vapor deposition. Alternatively, the organic barrier may be formed by printing. After forming the second inorganic barrier layer 43, the first detection lines 61 are formed on the inorganic barrier layers 41 and 43. The first detection lines 61 can be formed by, for example, ink-jet printing, offset printing, and photolithography process. After the first detection lines 61 are formed, the touch panel 2 is attached on the display panel 3. At that time, the sealing member 52 is disposed on the seal region A2, and the space between the display panel 3 and the touch panel 2 is filled with the filler 51.

As described above, the first substrate 30 is made of resin and has flexibility. Accordingly, the peripheral portion of the display panel 3 can be bent, or the portion in the connection region A3 can be folded. As a result, leeway in designing the organic EL display device 1 can be increased.

In the present embodiment, as shown in FIG. 6, the connection region A3 of the display panel 3 is folded opposite to the touch panel 2 (hereinafter, the folded portion is referred as to "folded portion D"). The folded portion D enables to reduce the width of the peripheral portion of the organic EL display device 1. As described above, the second detection lines 21C of the touch panel 2 are connected to the first detection lines 61 through the conductive particles 53 contained in the sealing member 52. Accordingly, the touch panel 2 does not need to include a region to be attached to external lines such as FPC. Therefore, the size of the touch panel 2 can be reduced by the unnecessary region, and the peripheral portion of the organic EL display device 1 can be reduced in the width.

As shown in FIG. 6, a spacer 71 is disposed between the folded portion D and the rest portion of the display panel 3 (that is, the spacer 71 is disposed between the folded portion D and a portion facing the folded portion D). The spacer 71 includes a peripheral surface 71a that curves like an arc. The folded portion D is folded along the peripheral surface 71a.

The spacer 71 is disposed below the connection side seal region A2s. A portion of the spacer 71 is located opposite to the conductive particles 53 contained in the sealing member 52 across the display panel 3. Such an arrangement of the spacer can reduce a stress caused in the connection side seal region A2s when the connection region A3 of the display panel 3 is folded back. For example, when the spacer 71 is pressed on the back surface of the first substrate 30 and then the connection region A3 of the display panel 3 is folded back, a stress caused in the connection side seal region A2s can be reduced. As a result, it is prevented that the contacts between the second detection lines 21C and the conductive particles 53 and the contacts between the first detection lines 61C and the conductive particles 53 are unstable.

As shown in FIG. 6, a portion of the spacer 71 is preferably also located between a portion including the terminals 31e and 31f to be connected with the FPC 65 and the back surface of the display panel 3. The arrangement of the spacer 71 described here enables the positions of the terminals 31e and 31f to be fixed and thus improves the connection stability between the terminals 31e and 31f and the FPC 65.

The spacer 71 may not be located on the entire display panel 3. For example, as shown in FIG. 6, the spacer 71 may be located only on the folded portion D of the display panel 3. This arrangement can secure a space under the display panel 3 and thus enables the space to be used for parts of an electric device equipping with the organic EL display device 1.

In the example of organic EL display device 1, the spacer 71 has a thickness larger than that of the first substrate 30. The spacer 71 is made of a resin, such as an acrylic resin. The thickness and the material of the spacer 71 are not limited to the examples described here.

Figure 7:
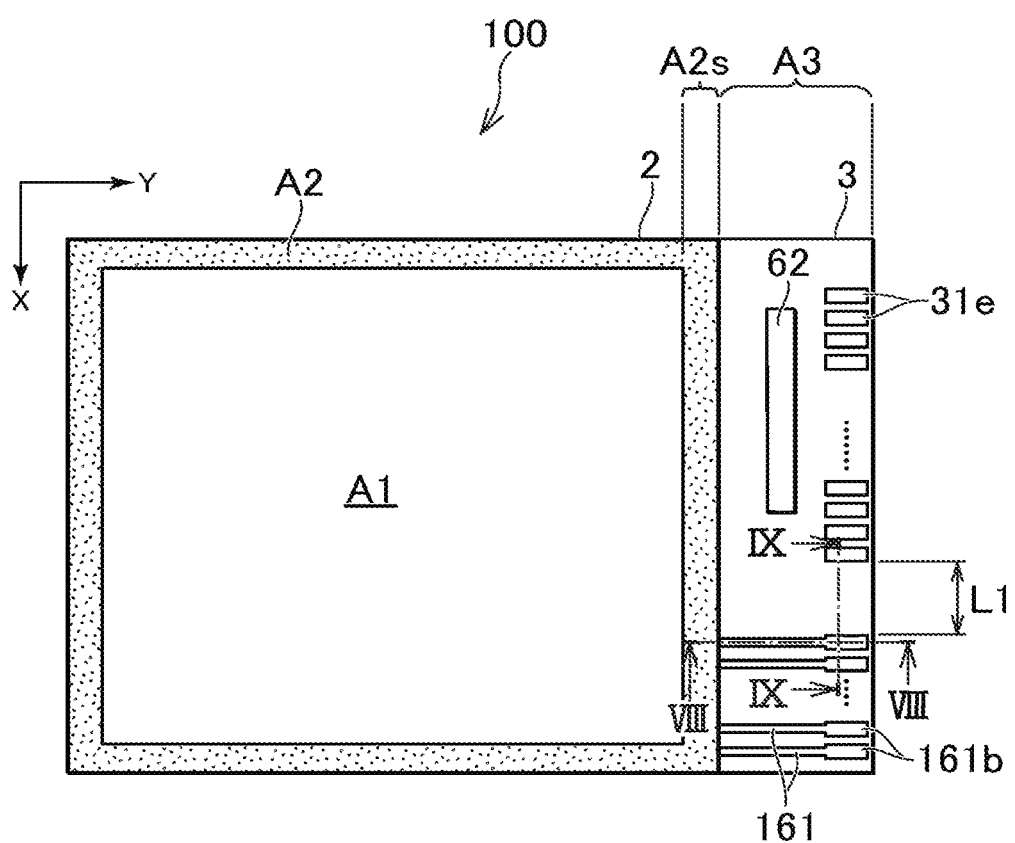
FIG. 7 is a plan view illustrating another exemplary display device of the embodiments according to the present invention.
Figure 8:
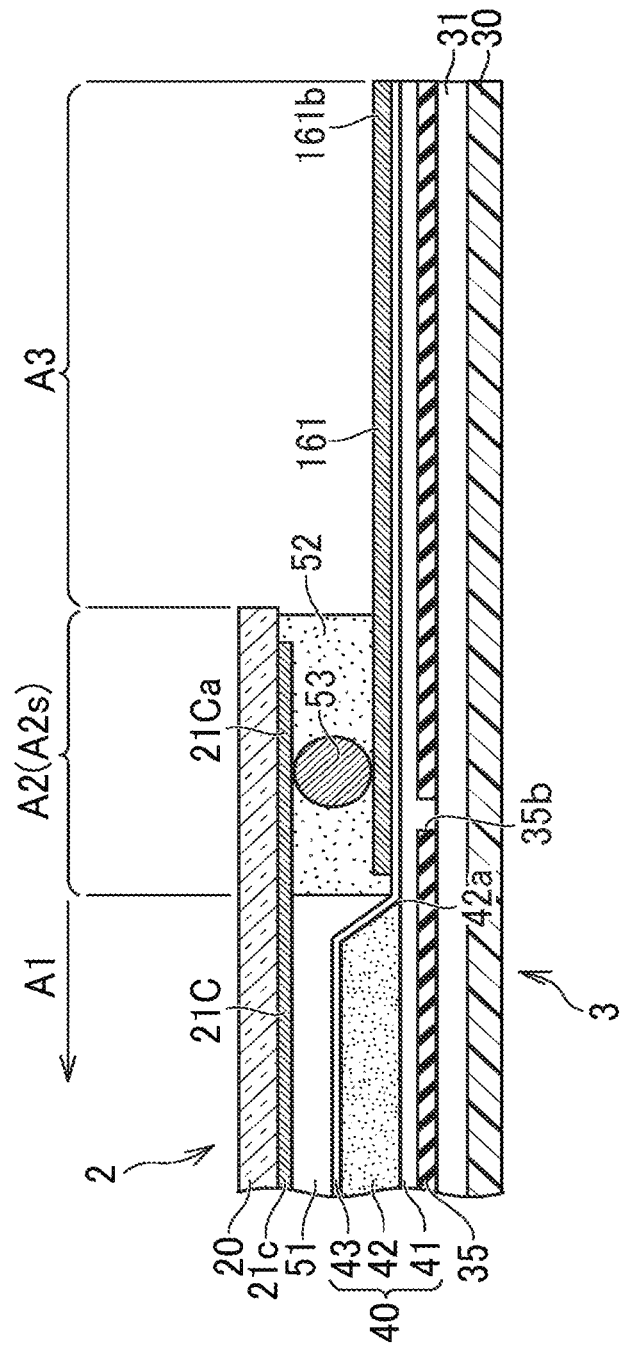
FIG. 8 is a cross section taken along line VIII-VIII indicated in FIG. 7.
Figure 9:
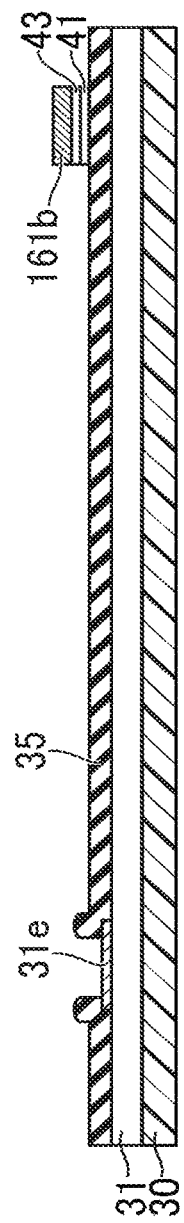
FIG. 9 is a cross section taken along line IX-IX indicated in FIG. 7.

FIGS. 7 to 9 show an organic EL display device 100 that is another example of embodiments according to the present invention. FIG. 7 is a plan view of the organic EL display device 100. FIG. 8 is a cross section taken along line VIII-VIII indicated in FIG. 7. FIG. 9 is a cross section taken along line IX-IX indicated in FIG. 7. In the following description, portions and matters different from those of the organic EL display device 1 will be mainly explained. The elements of the organic EL display device 100 that are not explained below are the same as those of the organic EL display device 1.

In the organic EL display device 100, second terminals 161b are provided instead of the second terminals 31f described above on the ends of the first detection lines 161. The first detection lines 161 are formed on the first inorganic barrier layer 41 and the second inorganic barrier layer 43. As shown in FIGS. 8 and 9, the second terminals 161b are formed in the same layer as the first detection lines 161 unlike the second terminals 31f. That is, the second terminals 161b are formed on the first inorganic barrier layer 41 and the second inorganic barrier layer 43, and made of the same material as that of the first detection lines 61. The structure described here enables the second terminals 161b to be made in the same process as that of the first detection lines 161.

As shown in FIG. 7, the plurality of first terminals 31e and the plurality of second terminals 161b are arrayed in one line. The distance between the first terminals 31e and the second terminals 161b, that is, the distance L1 between the first terminal 31e closest to the second terminals 161b and the second terminal 161b closest to the first terminals 31e is larger than the distance between two adjacent first terminals 31e. The larger distance can stabilize the connections between the first terminals 31e and FPC 65 and the connections between the second terminals 161b and FPC 65. In more detail, the second terminals 161b are formed on the inorganic barrier layers 41 and 43 and thus are positioned higher than the first terminals 31e. Accordingly, in a process in which the FPC 65 is pressed on the connection region A3, the FPC 65 may not be equally pressed on the terminals 31e and 161b. As shown in FIG. 7, the structure where the distance L1 between the first terminals 31e and the second terminals 161b is larger than the distance between two adjacent first terminals 31e can reduce the unevenness of the pressures applied to the terminals 31e and 161b from the FPC 65.

The organic EL display device 100 can be manufactured by the processes exampled as follows. The circuit layer 31 and the lower electrodes 32 are formed on the first substrate 30. Then, the bank layer 35 is formed so as to cover the peripheral portions of the lower electrodes 32. At the time, the bank layer 35 is formed not to cover the first terminals 31e. After that, the organic layer 33 and the upper electrode 34 are formed. Then, the inorganic barrier layer 41, the organic barrier 42, and the second inorganic barrier layer 43 are formed on the upper electrode 34 in the order of the layer 41, the barrier 42, and the layer 43. For the organic EL display device 100, unlike for the organic EL display device 1, the inorganic barrier layers 41 and 43 are formed throughput the entire the display panel 3 without a mask. Then, the first detection lines 61 are formed on the inorganic barrier layers 41 and 43 by ink-jet printing, offset printing, photolithography process, and the like. After that, the touch panel 2 is attached on the display panel 3. At that time, the sealing member 52 is disposed on the seal region A2, and the space between the display panel 3 and the touch panel 2 fills with the filler 51. Finally, the inorganic barrier layers 41 and 43 are removed from the connection region A3. For example, the inorganic barrier layers 41 and 43 are removed by ashing process. In the ashing process, the touch panel 2, the first detection lines 161 and the second terminals 161b works as a mask, and thus a mask dedicated for the ashing is not necessary.

The present invention is not limited to the embodiments described above and may be changed in various ways. For example, the following variation can be made.

The peripheral edge 42a of the organic barrier 42 may be located inward from the seal region A2s only on one side toward the connection region A3 among the four sides of the seal region A2. That is, the peripheral edge 42a of the organic barrier 42 may be located outward from the inner edge of the seal region A2 on the rest three sides of the seal region A2.

When a plurality of conductive particles 53 are arranged in the width direction (E direction shown in FIG. 5) of the connection side seal region A2s, the peripheral edge 42a of the organic barrier 42 may be located inward from the conductive particle 53 disposed outermost among the plurality of conductive particles 53 (that is, the peripheral edge 42a may be located inward from the conductive particle 53 disposed closest to the connection region A3), and the other conductive particles 53 may be disposed above the organic barrier 42.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A semiconductor device comprising:
a substrate;
a first insulator on the substrate;
a second insulator on the first insulator;
a plurality of detection electrodes, the plurality of detection electrodes overlapping the second insulator in a planar view;
a terminal on the substrate, the terminal located along an edge of the substrate;
a first detection line electrically connected to the terminal; and
a second detection line electrically connected to one of the plurality of detection electrodes, wherein
the first detection line and the second detection line are electrically connected with each other at a contact portion,
the contact portion is located between the plurality of detection electrodes and an edge of the second insulator in the planar view,
the substrate is configured to be folded back at a bent portion,
the bent portion is between the contact portion and the terminal, and
the first detection line and the first insulator overlap at the bent portion in the planar view.

2. The semiconductor device according to claim 1, wherein
the second insulator comprises multiple layers stacked on each other.

3. The semiconductor device according to claim 2, wherein the multiple layers comprise:
a first inorganic insulating layer;
a second inorganic insulating layer; and
an organic insulating layer between the first inorganic insulating layer and the second inorganic insulating layer, wherein
an edge of the organic insulating layer is located between the plurality of detection electrodes and an edge of the first inorganic insulating layer in the planar view,
the edge of the first inorganic insulating layer is located between the edge of the organic insulating layer and the edge of the substrate in the planar view,
the second inorganic insulating layer is in contact with the first inorganic insulating layer outside the edge of the organic insulating layer, and
the contact portion is located between the edge of the organic insulating layer and the edge of the second inorganic insulating layer in the planar view.

4. The semiconductor device according to claim 3, wherein
the bent portion is between the edge of the organic insulating layer and the terminal.

5. The semiconductor device according to claim 3, wherein
the bent portion is between the edge of the first inorganic insulating layer and the terminal.

6. The semiconductor device according to claim 1, wherein
the terminal is at an opposite side of the plurality of detection electrodes.

7. A semiconductor device comprising:
a substrate;
a first insulating layer on the substrate;
a second insulating layer on the first insulating layer;
a plurality of detection electrodes, the plurality of detection electrodes overlapping the second insulating layer in a planar view;
a terminal on the substrate, the terminal located along an edge of the substrate;
a first detection line electrically connected to the terminal; and
a second detection line electrically connected to one of the plurality of detection electrodes, wherein
the first detection line and the second detection line are electrically connected with each other at a contact portion,
the contact portion is located between the plurality of detection electrodes and an edge of the second insulating layer in the planar view,
the substrate is configured to be folded back at a bent portion,
the bent portion is between the contact portion and the terminal, and
the first detection line and the first insulating layer overlap at the bent portion in the planar view.

8. The semiconductor device according to claim 7, further comprising:
an organic insulating layer on the second insulating layer, and
a third insulating layer on the organic insulating layer, wherein
an edge of the organic insulating layer is located between the plurality of detection electrodes and an edge of the second insulating layer in the planar view,
the edge of the second insulating layer is located between the edge of the organic insulating layer and the edge of the substrate in the planar view,
the third insulating layer is in contact with the second insulating layer outside the edge of the organic insulating layer, and the contact portion is located between the edge of the organic insulating layer and the edge of the third insulating layer in the planar view.

9. The semiconductor device according to claim 8, wherein
the bent portion is between the edge of the organic insulating layer and the terminal.

10. The semiconductor device according to claim 8, wherein
the bent portion is between the edge of the second insulating layer and the terminal.

11. The semiconductor device according to claim 7, wherein
the terminal is at an opposite side of the plurality of detection electrodes.

12. A semiconductor device comprising:
a substrate;
a terminal on the substrate, the terminal located along an edge of the substrate;
a first detection line electrically connected to the terminal;
a first insulator between the substrate and the first detection line;
a second insulator on the substrate,
a plurality of detection electrodes, the plurality of detection electrodes overlapping the second insulator in a planar view; and
a second detection line electrically connected to one of the plurality of detection electrodes, wherein
the first detection line and the second detection line are electrically connected with each other at a contact portion,
the contact portion is located between the plurality of detection electrodes and an edge of the second insulator in the planar view,
the substrate is configured to be folded back at a bent portion,
the bent portion is between the contact portion and the terminal, and
the first detection line and the first insulator overlap at the bent portion in the plan view.

13. The semiconductor device according to claim 12, wherein
the second insulator comprises multiple layers stacked on each other.

14. The semiconductor device according to claim 13, wherein the multiple layers comprise:
a first inorganic insulating layer;
a second inorganic insulating layer; and
an organic insulating layer between the first inorganic insulating layer and the second inorganic insulating layer, wherein
an edge of the organic insulating layer is located between the plurality of detection electrodes and an edge of the first inorganic insulating layer in the planar view,
the edge of the first inorganic insulating layer is located between the edge of the organic insulating layer and the edge of the substrate in the planar view,
the second inorganic insulating layer is in contact with the first inorganic insulating layer outside the edge of the organic insulating layer, and
the contact portion is located between the edge of the organic insulating layer and the edge of the second inorganic insulating layer in the planar view.

15. The semiconductor device according to claim 14, wherein
the bent portion is between the edge of the organic insulating layer and the terminal.

16. The semiconductor device according to claim 14, wherein
the bent portion is between the edge of the first inorganic insulating layer and the terminal.

17. The semiconductor device according to claim 12, wherein
the terminal is at an opposite side of the plurality of detection electrodes.

* * * * *